(12) United States Patent
Yu et al.

(10) Patent No.: US 7,236,279 B2
(45) Date of Patent: Jun. 26, 2007

(54) DIGITAL OPTICAL SWITCH APPARATUS AND PROCESS FOR MANUFACTURING SAME

(75) Inventors: Duli Yu, Sugar Land, TX (US); Arjun Selvakumar, Bellaire, TX (US); Howard Goldberg, Sugar Land, TX (US); Taechung Yi, Houston, TX (US)

(73) Assignee: Input/Output, Inc., Houston, TX (US)

( * ) Notice: Subject to any disclaimer, the term of this patent is extended or adjusted under 35 U.S.C. 154(b) by 18 days.

(21) Appl. No.: 10/273,628

(22) Filed: Oct. 18, 2002

(65) Prior Publication Data

US 2003/0118277 A1 Jun. 26, 2003

Related U.S. Application Data

(60) Provisional application No. 60/345,919, filed on Nov. 9, 2001, provisional application No. 60/348,083, filed on Oct. 19, 2001.

(51) Int. Cl.
*G02B 26/08* (2006.01)
*G02B 6/26* (2006.01)
*H02N 1/00* (2006.01)

(52) U.S. Cl. ............... 359/198; 359/201; 359/224; 310/309; 385/18

(58) Field of Classification Search ........ 359/198–199, 359/223, 224, 298, 872, 876; 310/309
See application file for complete search history.

(56) References Cited

U.S. PATENT DOCUMENTS 5,914,801 A 6/1999 Dhuler et al. ............... 359/230

6,115,326 A 9/2000 Puma et al. ............... 367/118

(Continued)

FOREIGN PATENT DOCUMENTS

| EP | 1203748 A1 | 5/2002 |
|---|---|---|
| WO | WO01/04680 | 1/2001 |
| WO | WO0107945 | 2/2001 |
| WO | WO01/53194 | 7/2001 |
| WO | WO0161400 | 8/2001 |

OTHER PUBLICATIONS

S. Kurth et al.; *Synchronously Working Micromirrors for Beam Steering—Design and Application Aspects*, XP-002310357, SPIE Conference on Optical Scanning: Design and Application, Denver, Colorado, SPIE vol. 3787,0277-786X, Jul. 1999, pp. 63-73.

*Primary Examiner*—James Phan
(74) *Attorney, Agent, or Firm*—Madan, Mossman & Sriram, P.C.

(57) ABSTRACT

The present invention provides a digital optical switch apparatus and process for manufacturing the apparatus. The apparatus includes a mirror assembly coupled to a top cap and to a bottom cap. The top and bottom caps each include one or more electrodes that, when energized with electrical energy, move a mirrored surface to one of a plurality of discrete positions. Mirror assemblies can be cascaded to create a packaged assembly having any multiple of discrete positions. The process includes planar micro-machining techniques to create isolated islands for electrical feed through. The process enables mechanical bonding of multiple tiers via a single bond region and through a bond-pad window.

24 Claims, 13 Drawing Sheets

U.S. PATENT DOCUMENTS

| | | | |
|---|---|---|---|
| 6,143,583 A | 11/2000 | Hays | 438/39 |
| 6,198,180 B1 | 3/2001 | Garcia | 310/36 |
| 6,262,827 B1 | 7/2001 | Ueda et al. | 359/224 |
| 6,362,556 B1 * | 3/2002 | Hoen | 310/309 |
| 6,454,421 B2 * | 9/2002 | Yu et al. | 359/872 |
| 6,617,098 B1 | 9/2003 | Yu et al. | 430/323 |
| 2001/0029807 A1 | 10/2001 | Kurtz et al. | 438/455 |

* cited by examiner

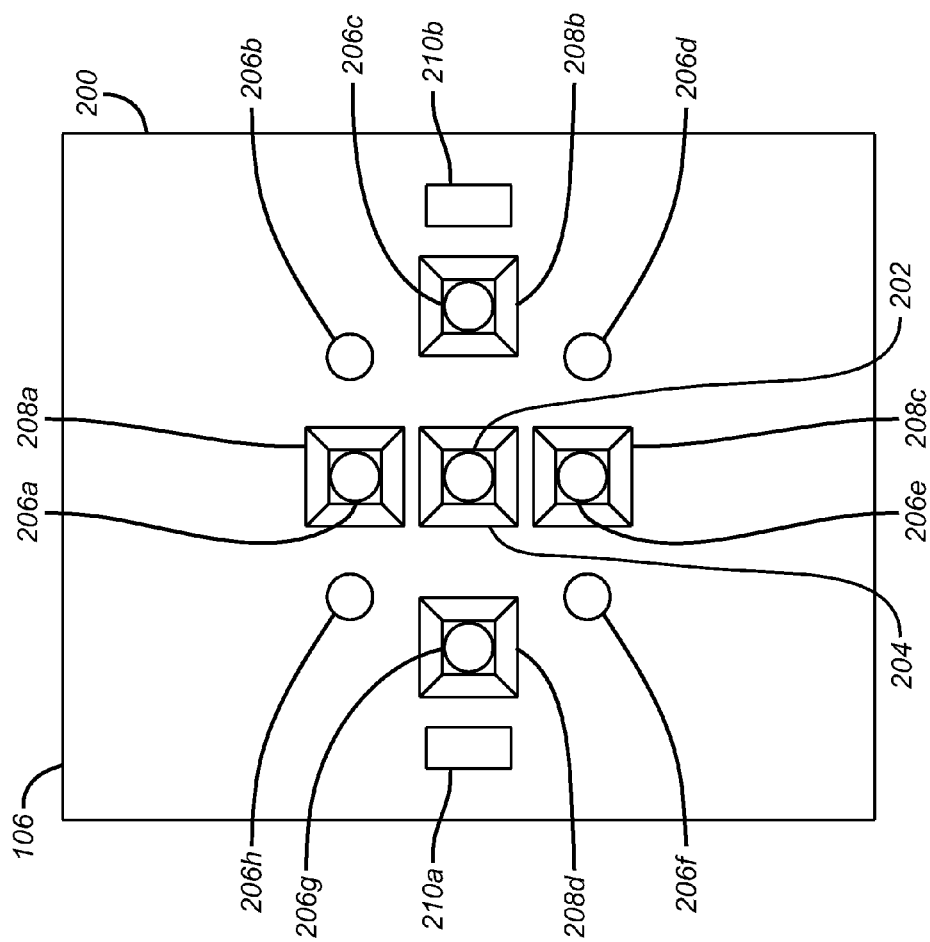

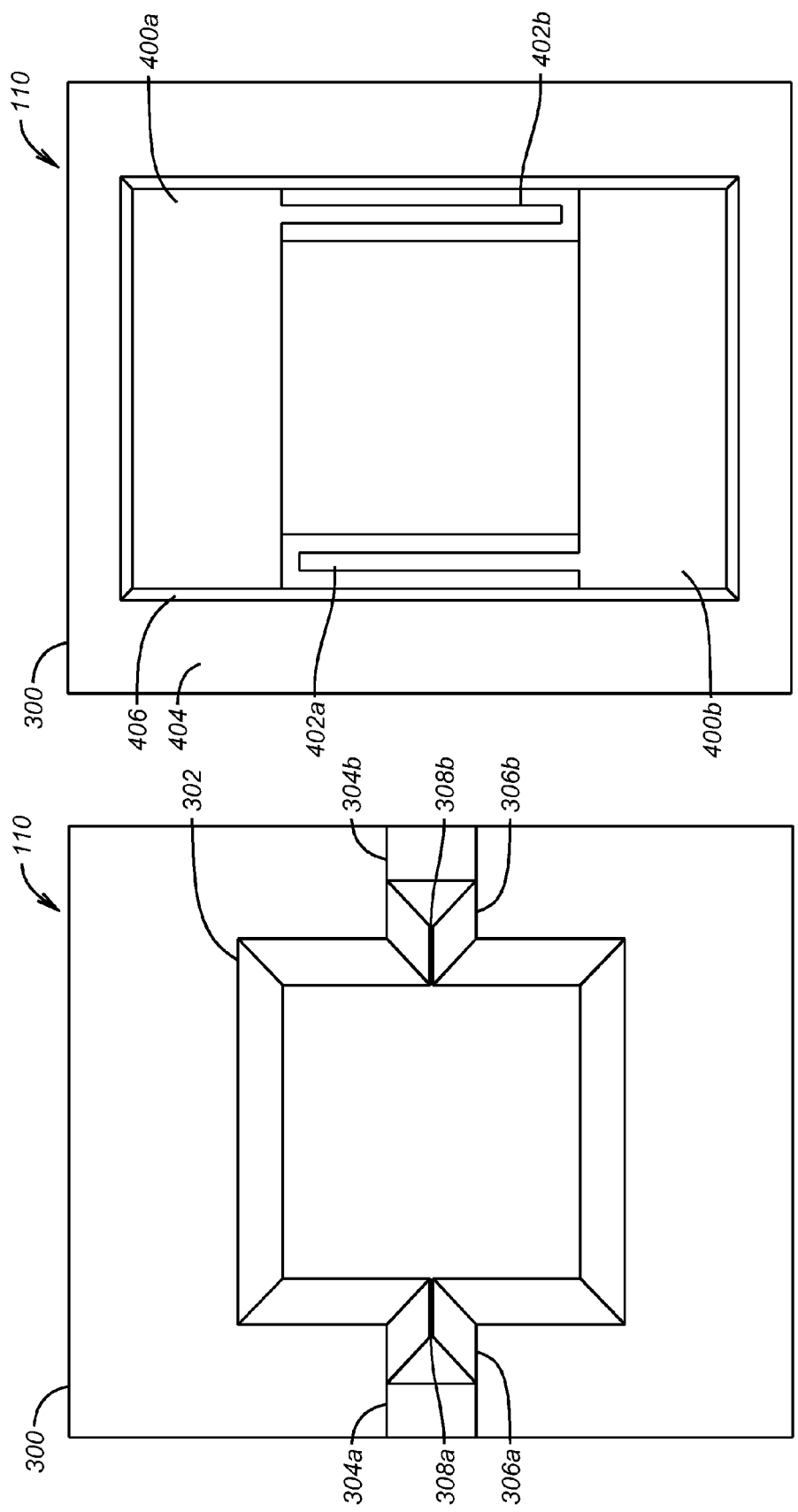

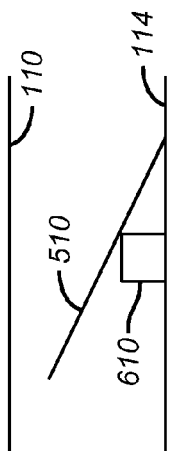
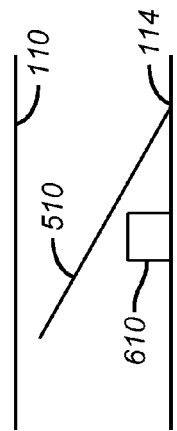
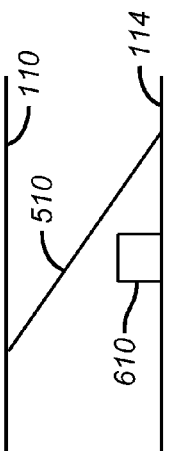
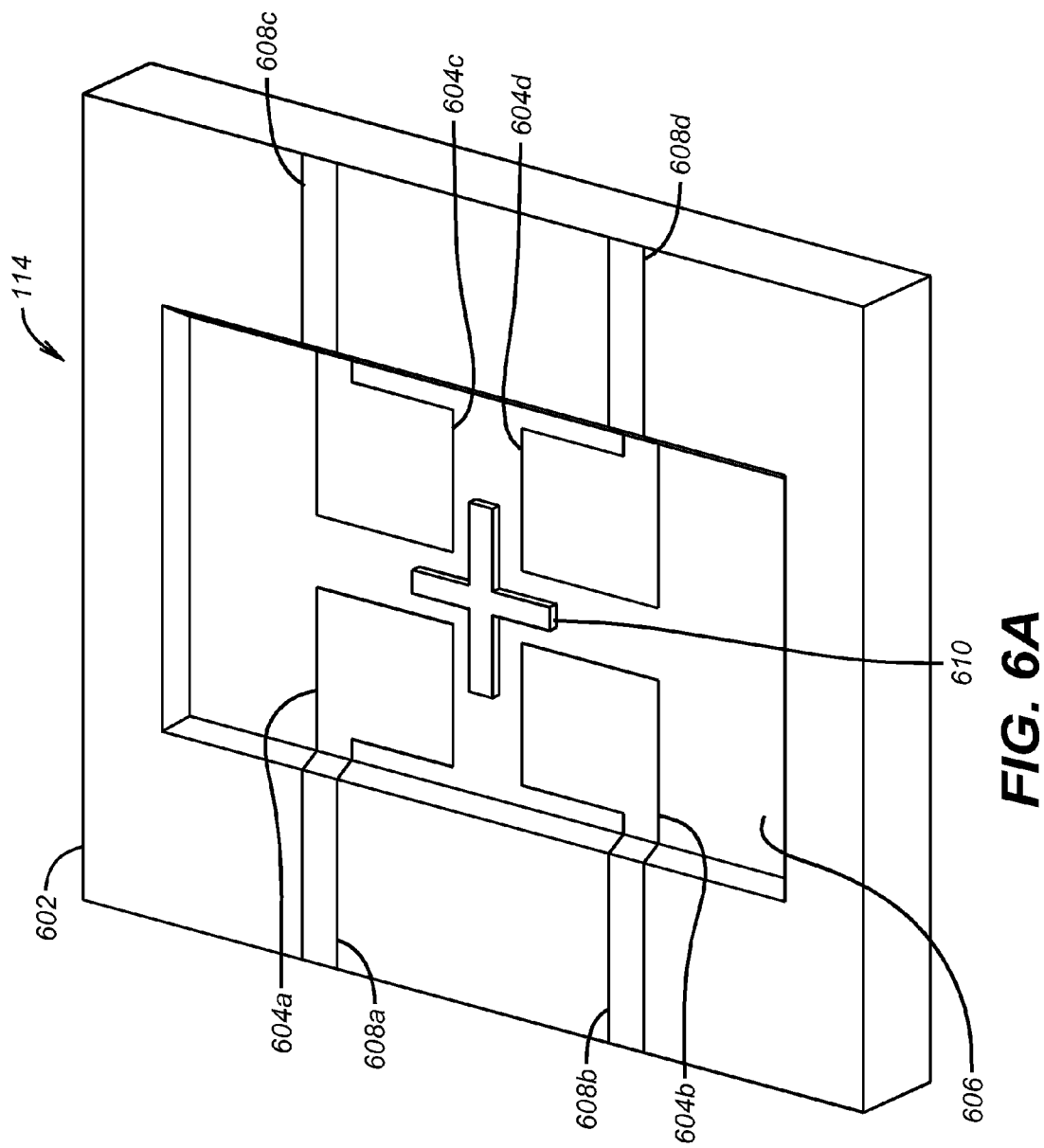
FIG. 6B
FIG. 6C
FIG. 6D
FIG. 6A

DIGITAL OPTICAL SWITCH APPARATUS AND PROCESS FOR MANUFACTURING SAME

CROSS-REFERENCE TO RELATED APPLICATIONS

This application is related to U.S. Provisional Application No. 60/348,083 filed on Oct. 19, 2001 and to U.S. Provisional Application No. 60/345,919 filed on Nov. 9, 2001; each application being fully incorporated herein by reference.

BACKGROUND OF THE INVENTION

1. Field of the Invention

The present invention generally relates to three-dimensional micro-machined devices and more particularly to a micro-machined mirror apparatus having multiple axes of rotation and discrete positioning.

2. Description of the Related Art

Micro-machined devices have gained widespread use in a variety of applications in recent years. One such application is the use of such devices in optical applications in which a micro-machined mirror structure is used as an optical switch to deflect an incident light beam to redirect the light beam in a plurality of directions.

The typical MEMS mirror used as an optical switch includes a micro-machined mirror structures that can be deflected by applying electrical energy to one or more electrodes. The energized electrodes provide a force on the mirror thereby inducing an angular change in the surface plane of the mirror.

It is desirable to have a mirror surface with two axes of angular (i.e. rotational) freedom in these optical switches. Some typical devices provide such freedom by providing a gimbaled coupling between the mirror and a mirror support structure, then providing a gimbaled coupling between the mirror support structure and a second support structure. Other known devices include a pedestal-type mirror structure.

While these typical devices provide the desired degrees of freedom, they suffer from several disadvantages. These devices provide only analog movement. This movement is a continuous sweeping movement from one angular position to another angular position. As such, any induced mechanical shock during operation may move the mirror thereby disrupting the operation. Moreover, accurate positioning using electrical energy is very difficult. Thus it is desirable to provide a planar mirror surface with multiple axes of rotation, and providing digital positioning. Digital positioning as used herein is defined as one or more discrete planar positions including known angular relationships to a beginning or reference planar angle.

Another problem with the typical optical switch is that they are relatively difficult to manufacture. MEMS devices are three-dimensional structures. MEMS optical switches typically require at least two stacked layers having electrodes and electrode contacts passing from one layer to the next. The conventional process includes non-planar etching and dicing techniques that increase manufacturing time and reduce the reliability of the final product. Thus, it is desirable to provide a product manufactured using planar processes for etching, bonding and electrode traversal of multiple tiered devices.

SUMMARY OF THE INVENTION

The present invention addresses one or more of the above-identified problems found in conventional MEMS optical switches, such as those conventional devices described above. The present invention provides an optical switch comprising multiple layers of structure including a mirrored surface having digital positioning. Furthermore, the present invention provides a process of manufacturing a MEMS three-dimensional structure using planar methods.

The present invention provides a micro-machined apparatus including a housing and a support structure coupled to the housing. A mass is coupled to the support structure by a pair of single-gimbaled structures for providing rotational movement of the mass about two axes of rotation. The structures are preferably T-shaped hinges. A plurality of electrodes is coupled to the structure. The electrodes are energized with electrical power for providing a selectable force to the mass that moves the mass in a plurality of angular directions. A plurality of travel stops are positioned within the housing for arresting movement of the mass such that the mass position is one of a plurality of discrete predetermined angular positions.

Another aspect of the present invention provides a micro-machined cascaded digital optical switch comprising two or more mirror assemblies coupled in cascading relationship. Each mirror assembly includes a mirror coupled to a support structure by a pair of substantially T-shaped hinges for providing rotational movement of the mass about first and second axes of rotation, a top cap having a plurality of first electrodes, the top cap being bonded to the mirror support structure and a bottom cap having a plurality of second electrodes, the bottom cap being bonded to the mirror support structure, wherein the first and second electrodes when energized with electrical power provide a selectable force to the mirror for moving the mirror in a plurality of angular directions, and a plurality of travel stops positioned about the mirror for arresting movement of the mirror such that the mirror position is one of a plurality of discrete predetermined angular positions. The assemblies might be coupled using fiber optics or a fixed reflective surface might be used for reflecting light exiting one mirror to a second mirror.

Another aspect provides two mirrors in a face-to-face relationship. A first mirror received light through any of a plurality of input ports. The light is reflected an in internal incident light beam to a second mirror by controlling the position of the first mirror. The internal incident light beam enters a second mirror through a port. The second mirror is controllably positioned to reflect the internal incident light beam to exit the assembly through any one of a plurality of exit ports.

Another aspect of the present invention provides a process of manufacturing a micro-machined apparatus. The process comprises providing a first substrate with a plurality of electrically isolated islands, providing an electrically conductive bond pad on each island, providing at least one second substrate having a plurality of electrical leads, and bonding the first substrate to the second substrate wherein each electrical lead is electrically coupled to one of the bond pads thereby creating a multi-tier device having electrically isolated electrical leads of one tier being accessible at another tier.

Another aspect of the present invention provides a process of manufacturing a micro-machined apparatus comprising providing a first substrate with an electrically non-conducting surface. An in-situ shadow mask is then provided to shadow one or more predetermined regions of the surface. An electrically conductive material is then deposited over the substrate and shadow mask, wherein the shadowed regions remain electrically non-conductive after the metal deposition.

These several aspects enable transferring electrical feedthrough from each layer of a three-layer stack to accessible wire bond pads located in the top surface of the bottom and middle layers of the stack. Electrical conduits formed on the underside of the top cap of the stack are coupled to the top surface of the middle layer through isolated bond islands. Electrical paths on the middle layer lead to larger bond pads. Electrical conduits on the bottom layer of the three-wafer stack are accessed through openings formed in the middle layer.

The present invention allows manufacturing personnel or machinery access to the several bond pads via multiple electrical conduits located on various wafers of the three-wafer stack. The conduits are electrically insulated from each other. The process obviates the need for complicated through-wafer via fabrication, and provides a planar machining process to fabricate the multi-tier MEMS structure.

BRIEF DESCRIPTION OF THE DRAWINGS

For detailed understanding of the present invention, references should be made to the following detailed description of the preferred embodiment, taken in conjunction with the accompanying drawings, in which like elements have been given like numerals and wherein:

FIG. 2 is a top view of the apparatus 106;

FIG. 3 is a top view of the top cap 110;

FIG. 4 is a bottom view of the top cap 110 showing top cap electrodes;

FIG. 6A is an isometric view of the bottom cap 114;

FIGS. 6B–D are schematic illustrations of alternative embodiments of the apparatus;

DESCRIPTION OF THE PREFERRED EMBODIMENT

Figure 1A:
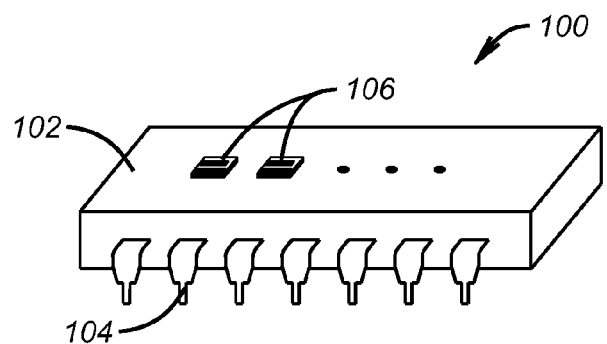
FIG. 1A is a packaged mirror array apparatus according to the present invention.

FIG. 1A is a packaged micro-electromechanical system (MEMS) mirror array apparatus 100 according to the present invention. The apparatus 100 includes a package 102 such as a typical printed circuit board (PCB) mountable housing or other frame structure known in the art, and a plurality of electrically conductive leads 104. As will be described later with reference to FIG. 1C, the packaged assembly may include one or more optional overlays 106. The apparatus 100 of the present invention is useful as a digital optical switch for use in fiber optic or optical laser systems.

Figure 1B:
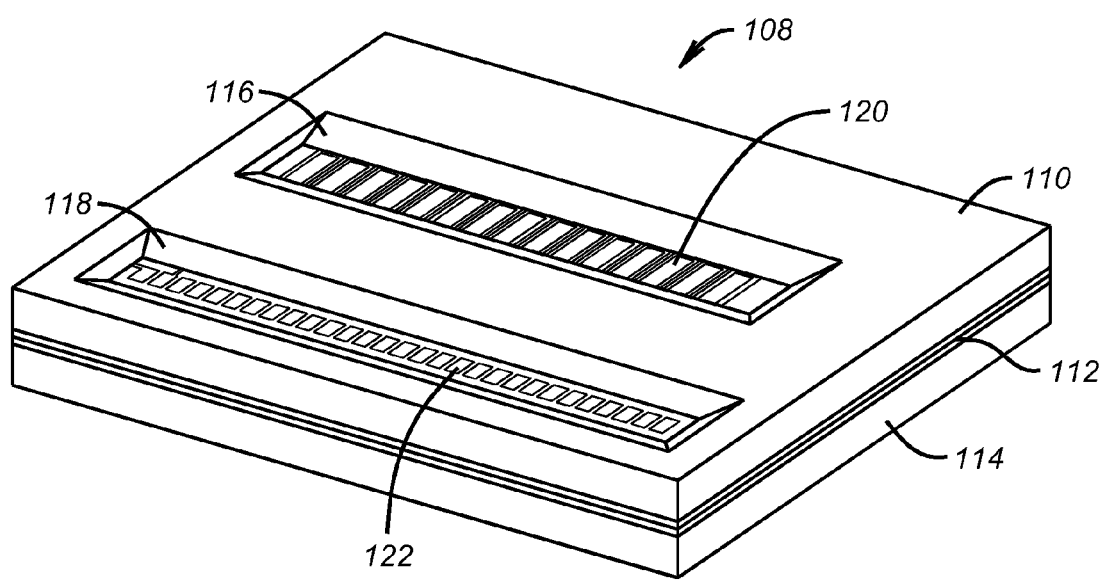
FIG. 1B is a 1×N mirror array stack assembly according to the present invention and used in the packaged apparatus of FIG. 1A.

Referring to FIG. 1B, the apparatus 100 includes an internally mounted 1×N mirror array stack assembly 108 according to the present invention. The term 1×N as used herein describes one or more devices combined in an array, wherein the variable term N is an integer ranging from 1 (for a single device) to a positive value of 8 or more. The array assembly 108 includes a top electrode wafer 110, a thinned mirror wafer 112 and a bottom electrode wafer 114.

The top electrode wafer 110, also called herein "top cap 110", includes a mirror window 116 and a bond pad window 118 spaced apart from the mirror window 116. The mirror window 116 provides an optical path that allows light to pass through the top cap 110 to meet one or more mirrors 120 integral to the mirror wafer 112. The bond pad window 118 allows easy manufacturing access to a plurality of electrically conductive bond pads 122. The plurality of bond pads 122 are connected to the electrical leads 104 for final packaging of the apparatus 100.

Figure 1C:
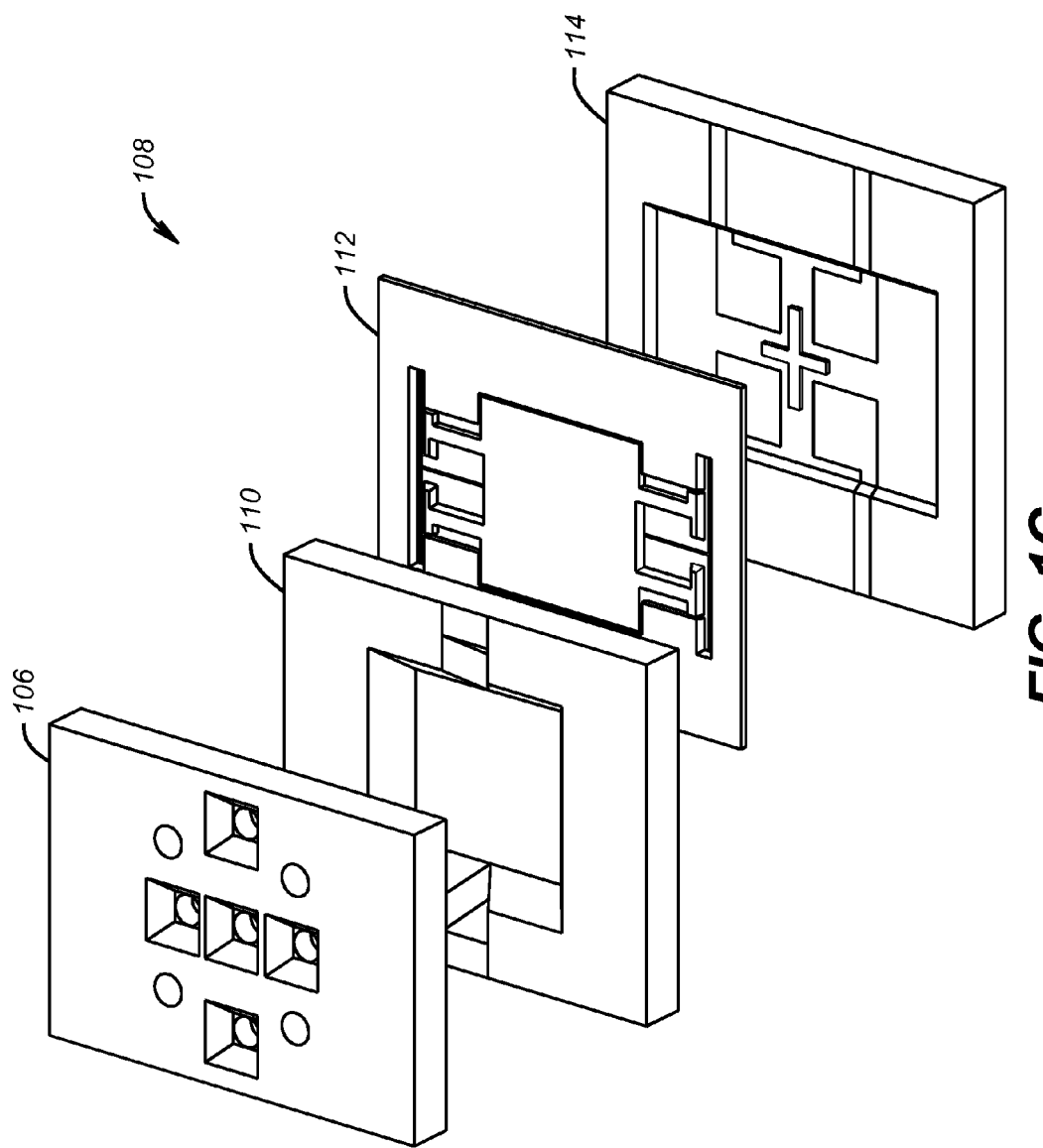
FIG. 1C is an exploded view of a micro-electromechanical systems (MEMS) mirror assembly according to the present invention.

FIG. 1C is an exploded view of the 1×N mirror array assembly 108 shown as a 1×1 (single-mirror stack) for simplicity of explanation. Shown is the three-wafer stack assembly 108, including the bottom cap 114, the thinned mirror wafer 112, top cap 110 and the optional light-guide overlay 106. The mirror wafer 112 is a dual axis moveable mirror assembly, which is bonded between the top cap 110 and bottom cap 114 to create the three-dimensional MEMS assembly 108. The assembly 108 is then bonded to the frame 102 described above and shown in FIG. 1A. The light-guide overlay 106, when used, is bonded to the frame 102 such that the overlay 106 and top cap 110 are separated by a distance sufficient to allow light to travel through the light guide overlay and mirror window 116 along predetermined light paths.

FIG. 2 is a top view of the light-guide overlay 106. The overlay 106 has a main structure 200. Formed in the structure are an incident light port 202 and an incident light guide 204 in the approximate center of the structure 200. Incident light enters the apparatus 100 through the incident light port 202, with the incident light guide 204 providing angular tolerance for the incident light. The incident light is reflected within the apparatus 100 such that the reflected light travels along one of a plurality of discrete exit paths. The term "discrete" as used herein means substantially motionless when used to describe position. The term further means substantially invariant when used to describe a light path.

Light following an exit path exits the apparatus through one of a plurality of exit ports 206a–h. Exit ports 206a–h may or may not include an exit light guide 208a–d for allowing interface tolerance between the apparatus 100 and an interfacing device (not shown). Similarly, incident light guide 204 is an optional feature. Furthermore, those skilled in the art with the benefit of the present disclosure would recognize that port 202 illustrates and described herein as incident light port 202 might serve as an exit port in an alternative embodiment. In this alternative embodiment any of the exit ports 206a–h can be adapted to serve as an incident light port.

The optional light-guide overlay 106 is not required for an effective embodiment of the present invention. For example, applications having incident light comprising a laser may not need a guide. In such applications, the laser has a substantially invariant beam angle for the distances traveled. Thus the light paths are defined by the incident angle of the laser and the angle of reflection. In one embodiment, digital mirror assemblies are cascaded and the light guide overlay 106 is beneficial for cascading the assemblies. As will be explained later, each of the eight light guide output ports may be coupled to an input port of one of eight cascaded assembly overlays. A preferred coupling is by optic fibers. In this manner, the exit path is not necessarily restricted to a straight-line path.

The overlay 106 includes one or more mechanical bond pads 210a, 210b to allow mechanical bonding to the external optical packaging frame 102.

FIG. 3 is a top view of the top cap 110. The top cap 110 is formed in a substrate 300 such as a silicon wafer and includes a window 302 for allowing light to pass from the overlay 106, through the top cap 110 to the mirror assembly 112. Reflected light passes from the mirror assembly 112, through the window 302 and out of the apparatus 100 through one of the exit ports (see FIG. 2 at 206a–h).

The top cap 110 includes electrically conductive contact pads. 304a–b that provide conductive paths for energizing top cap electrodes (not visible in this view). Each path 304a–b includes a wedge recess 306a–b terminating in a groove opening 308a–b. This allows for a process known as electrical feed-through via for making an electrically conductive path from the contact pads 304a–b through the top cap 110 to connect the electrodes on the bottom of the top cap. To do this, electrically conductive metal is deposited using later described processes to the top of the top cap. The metal passes into the wedge recesses 306a–b, through the groves 308a–b to make contact with lead strips located on the bottom of the top cap.

FIG. 4 is a bottom view of the top cap 110 showing a two-electrode configuration. Shown are top cap electrode feed strips 402a–b that are electrically coupled to the top cap contact pads 304a–b by the electrical feed-through via process just described. The top cap 110 has a bottom surface 404 in which a recess 406 is formed according to the process of the present invention. Two top cap electrodes 400a–b are integral to the lead strips 402a–b, both of which are metal deposited within the recess 406. Metal deposition of electrodes will be described in a process embodiment of the present invention. The electrodes 400a–b and lead strips 402a–b are preferably gold, but may be any suitable electrically conductive metal such as silver or aluminum or an alloy.

It is important to note that electrical feed through via is only one embodiment contemplated by the present invention. Other methods of electrical feed through enabled by the processes of the present invention are isolated-island method of FIGS. 7A–C. Also, the known technique if drill and fill could be used to provide electrical feed through. Drill and fill methods, however, are more time-consuming and less precise than the isolated island method and thus less desirable.

Figure 5:
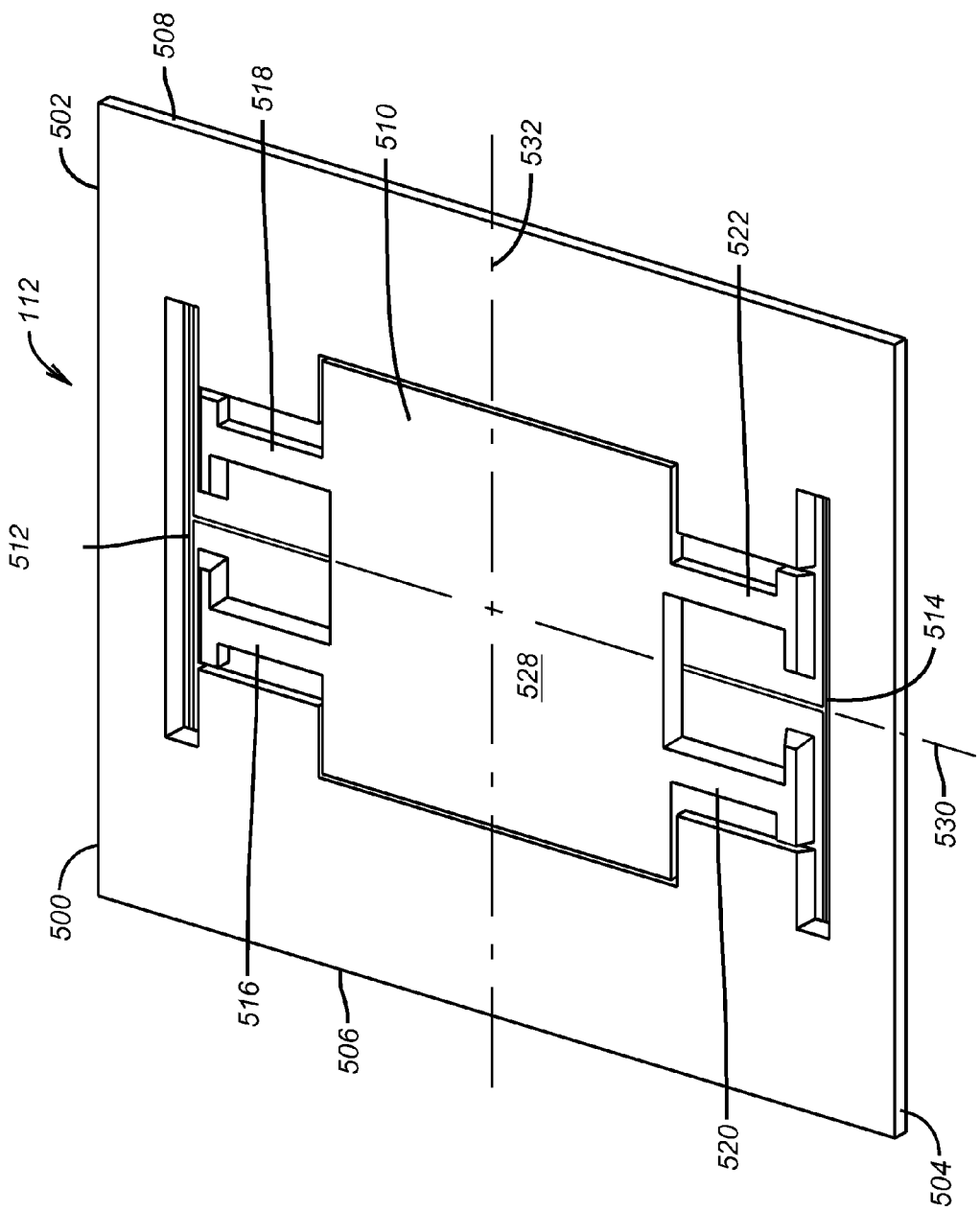
FIG. 5 shows the mirror assembly 112 made according to one embodiment of the present invention.

FIG. 5 is an isometric view of the mirror assembly 112. The assembly 112 is preferably an integral structure formed by micro-machining processes according to the present invention. The mirror assembly 112 is preferably an integral structure having a mass coupled to a support structure by a pair of substantially T-shaped hinges 512, 514, which provides a single-gimbaled structure with two axes of rotation. An example of one such mirror assembly is described in detail in U.S. patent application Ser. No. 09/352,835, filed on Jul. 13, 1999, the entire contents of which are incorporated herein by reference. An example of a mirror assembly having a plurality of bottom cap electrodes for providing two axes of rotational movement is described in detail in U.S. patent application Ser. No. 09/873,054, filed on Jun. 1, 2001, the entire contents of which are incorporated herein by reference. The present invention provides digital positioning, control of movement damping, and manufacturing processes among other things not provided in these previous applications. Other structures, however, are considered within the scope of this invention. For example, any single-gimbaled hinge structure could replace the T-shaped hinge described herein.

FIG. 5 shows the mirror assembly 112 made according to one embodiment of the present invention. The mirror assembly 112 includes a frame or mirror support structure 500 having support members 502, 504, 506 and 508. The assembly 112 further comprises a mirror collection plate 510 with a reflective surface 528, a top T-shaped hinge 512, a bottom T-shaped hinge 514, a top left travel stop finger 516, a top right travel stop finger 518, a bottom left travel stop finger 520, and a bottom right travel stop finger 522.

The advantage of digital positioning of the mirror collection plate 510 is provided by interaction between one or more of the travel stop fingers 518–522 and at least one of the top cap 110 and bottom cap 114. The final position is determined by the interaction along with electrical energy applied to one or more electrodes in the apparatus 100. In this manner a mirror can be created having discrete states #1–#8. Those skilled in the art would appreciate that the mirror collection plate 510 could be used as a multi-point travel stop, thereby eliminating the need for the travel stop fingers 516, 518, 520, and 522.

The 8 individual states of the mirror is each of these alternative embodiments can be described together for brevity. For these embodiments, state #1 is created when the upper travel stop fingers 516 and 518 interact with the bottom cap 114 or when the top edge of the mirror collection plate 510 interacts with the bottom cap 114. State #2 is created when the two lower travel stop fingers 520 and 522 interact with the bottom cap 114 or when the lower edge of the mirror collection plate 510 interacts with the bottom cap 114. State #3 is created when the left travel stop fingers 516 and 520 interact with the bottom cap 114 or when the left edge of the mirror plate interacts with the bottom cap 114. State #4 exists when the right travel stop fingers 518 and 522 interact with the bottom cap or when the right edge of the mirror plate interacts with the bottom cap 114. State #5 is created when the upper right travel stop finger 518 or the upper right corner of the mirror collection plate 510 contacts the bottom cap 114. State #6 is created when the upper left travel stop finger 516 or the upper left corner of the mirror 528 contacts the bottom cap 114. State #7 exists when the lower right travel stop finger 522 or the lower right corner of the mirror collection plate 510 contacts the bottom cap 114. State #8 exists when the lower left travel stop finger 520 or when the lower left corner of the mirror collection plate 510 contacts the bottom cap 114.

Those skilled in the art with the benefit of this disclosure would recognize that the present invention is useful in the above-described digital mode or in an analog mode. As the mirror collection plate 510 moves between any two discrete states, the movement is analog in nature. Therefore, one only need to precisely control electrode voltage to operate the mirror in a three-dimensional analog mode. This analog mode of operation preferably uses a critically damped, or overdamped, mirror.

The frame 500 provides the overall support structure for the mirror assembly 112. The thickness of the collection plate 510 may range, for example, from about 10 to 70 microns depending on desired damping characteristics and to provide a compact structure having a low mass. In a preferred embodiment, beams of the T-shaped hinges 512, 514 have effective beam lengths ranging from about 500–2500 microns and cross sections of about 8,000 microns$^2$ to 160,000 microns$^2$ in order to absorb shock loads of about 2000 g/0.5 ms half sine wave input.

The mirror collection plate 510 is coupled to the top T-shaped hinge 512 and the bottom T-shaped hinge 514. In this manner, the mirror collection plate 510 is provided two axes of rotation 530, 532. In a preferred embodiment, the axes 530, 532 are substantially perpendicular to one another. One axis 530 being positioned substantially along a first centerline of the mirror collection plate 510 and is coincident with the center of the T-shaped hinges, 512 and 514, thereby providing a common axis of rotation for the springs. The other axis 532 is position perpendicular to the first axis 530 and runs substantially along a second centerline normal to the first centerline of the assembly 112.

The reflective surface 528 is coupled to the top of the mirror collection plate 510. In this manner, dual-axis rotation of the mirror collection plate 510 about the axes 530, 532 causes incident light from a light source (not shown) to reflect off of the reflective surface 528 in a plurality of directions.

The reflective surface 528 may be comprised of any number of conventional commercially available optically reflective surfaces such as, for example, gold, silver or aluminum.

FIG. 6A is an isometric view of the bottom cap 114. The bottom cap 114 includes a plurality of electrodes 604a–d positioned within a cavity 606 formed in the surface 602 of the bottom cap 114. Each electrode has an associated conductive lead 608a–d extending from the electrode to a perimeter location on the bottom cap 114. As shown, electrode 604a is diagonal to electrode 604d and electrode 604b is diagonal to electrode 604c. In operation, the leads are connected to an electrical power source (not shown) adapted to provide electrical power to any combination of electrodes. The bottom cap also includes an optional damping baffle 610. The damping baffle is a movement control structure that provides airflow resistance to mirror movement for tuning damping. In one embodiment, the damping baffle acts as a pedestal for arresting vertical movement of the mirror when energy is applied to the electrodes 604a–d alone. The pedestal assists in converting the vertical movement into rotational movement about one or more axes.

As discussed above, the mirror function is to assume one of several discrete positions upon application of energy to top cap and bottom cap electrodes. Damping is a function of several manufacturing characteristics and parameters. Among these are materials selected, material thickness, hinge shape, viscosity of internal fluid (e.g., amount and purity of air trapped within the assembly) and so forth. A severely underdamped mirror will tend to overshoot the desired position and then settle into the desired position after several oscillations. A severely overdamped mirror will move toward the desired position much too slowly for practical optical switching application. Therefore, damping movement control is desirable. A damping level called critical damping is desired to arrest mirror movement while providing quick response. A critically-damped mirror will quickly move to the selected position without overshooting or oscillation.

It is important to note that the damping baffle 610 may be constructed as desired to either contact the mirror collection plate 510 during operation or to not contact the mirror collection plate 510. FIGS. 6B–D illustrate this point. FIG. 6B shows an embodiment wherein the mirror 510 contacts the damping baffle 610 and the bottom cap 114 to effect one of the discrete switching states. FIG. 6C shows an alternative embodiment of a mirror assembly in the same switching state, but the mirror 510 only contacts the bottom cap 114, and does not contact the damping baffle 610 or the top cap 110. FIG. 6D shows a preferred embodiment in which the mirror 510 is in the same switching state and contacting the top cap 110 and the bottom cap 114, but is not in contact with the damping baffle 610. Each embodiment is constructed by selecting the dimensions of the damping baffle and mirror to create the desired embodiment.

In a particularly useful embodiment of the present disclosure, the mirror array assembly 108 may be combined with substantially similar assemblies to effectively multiply the number of digital optical switching states from any number of output paths. Using the exemplary 8-state embodiment of the digital mirror apparatus 100 described above and shown in FIGS. 1A–1C, a single input or incident beam of light may be digitally switched to $8^n$ output paths thereby creating a 1×$8^n$ digital switch assembly. Here, n is an integer value defined by the number of mirror assemblies cascaded.

Figure 10A:
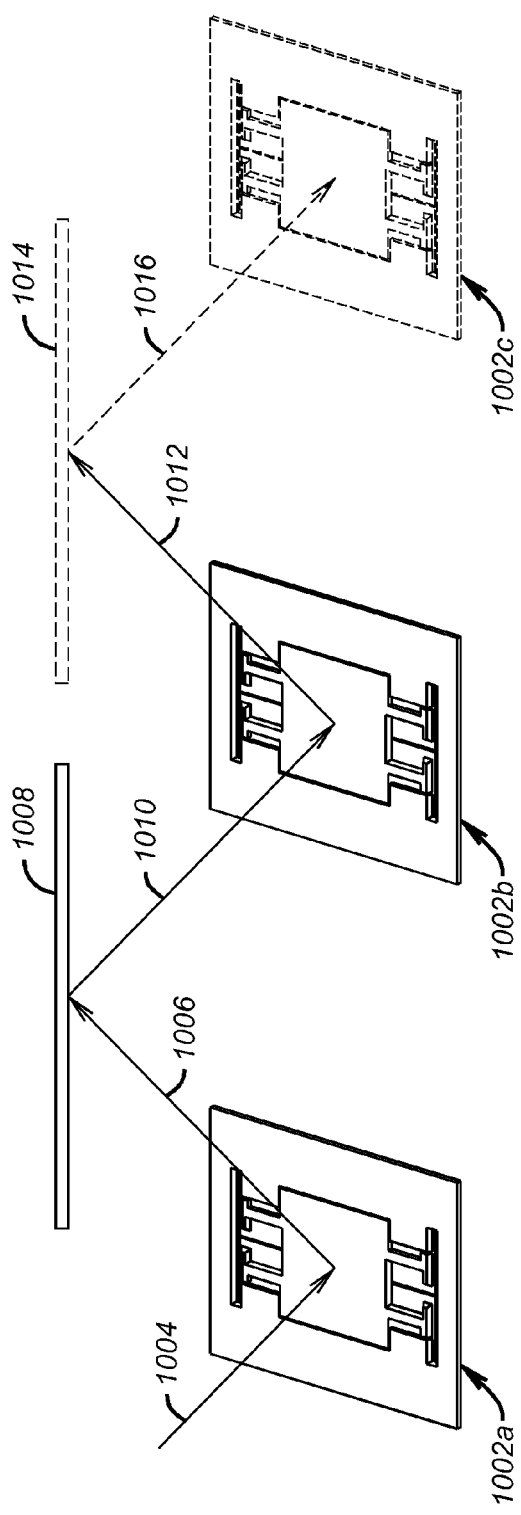
FIGS. 10A–B illustrate operation of alternative embodiments of a cascaded digital mirror according to the present invention.

A simple conceptual illustration is provided in FIG. 10A. Shown is a cascaded series of mirror assemblies 1002a–c. Incident light 1004 reflects from a first mirror assembly 1002a along a first exit path 1006 to meet a reflector 1008. The reflector 1008 is a fixed reflective surface formed using substantially identical micro-machining process as the one described in process 700. Light reflects from the reflector 1008 along a selected 1 of 8 discrete paths to meet another digital optical switch mirror assembly 1002b. Each one of the 8 paths preferably leads to a substantially similar mirror 1002b, but only 1 is shown for illustration of the present invention. In turn, and limited by the number of cascaded mirror assemblies, light reflects from the second mirror along a selected 1 of 8 paths 1012 and so forth to a plurality of cascaded reflectors 1014 and switches 1002c. Note that the number of states described as $8^n$ is defined as the maximum number of output states of an 8-state digital optical switch. Although an 8-state digital mirror is a preferred embodiment of the apparatus 100 of the present invention, any digitally-positioned mirror as the term digital is defined herein is contemplated by the present invention. There are, the actual number of digital switching positions is better defined as $X^y$ states, where X is the number of positions possible by a mirror assembly and y is the number of cascaded mirrors. Theoretically, the positioning capability of any one mirror is not determinative of the number of possible positions of any one cascaded mirror. So, any number of digital switch output states is within the scope of the present invention. Therefore, a 1×A digital switch apparatus, wherein A is any integer greater than 1, is within the scope of the present invention.

Once cascading is understood, parallel configurations of digital optical switching arrays then logically follow. In this alternative embodiment, a 1×$8^n$ cascade may be packaged in parallel with any number of similar array cascades to form an M×8" digital optical switch, where M is an integer formed by the number of cascades packaged in parallel.

Figure 10B:
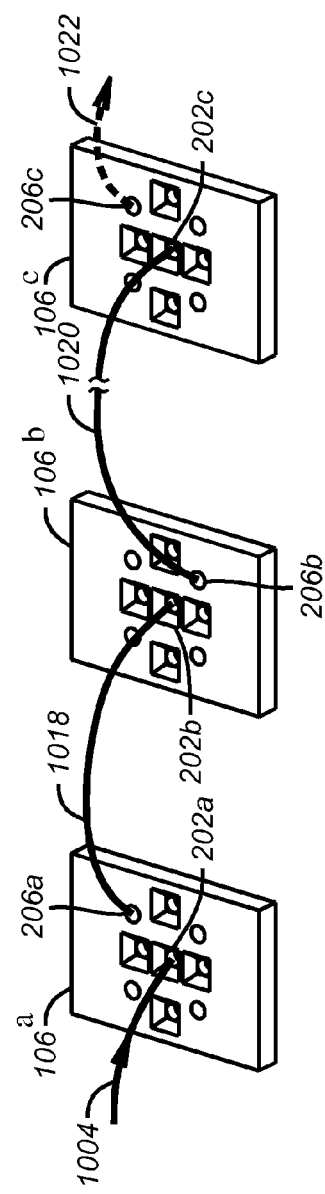

In an alternative cascaded embodiment, the reflectors 1008 and 1014 are 25 not used. In this alternative embodiment, light coupling is accomplished by optic fibers 1018, 1020 and 1022 etc. and light guide overlays 106. Referring to FIG. 2 and FIG. 10B, incident light travels along path 1004 to enter the first mirror 1002a via incident light port 202a of the first mirror overlay 106a. Note that incident light path 1004 may or may not be an optic fiber. Light exits the first assembly 1002a via an exit port 206a and travels along an optic fiber light path 1018 to enter 1 of 8 mirror assemblies 1002b via an incident light port 202b of the second mirror overlay 106b. The light exits the second mirror assembly 1002b through overlay exit 206b. Exiting light travels to the next cascaded mirror assembly 1002c via another optic fiber 1020 to enter incident light port 202c. The reflection is repeated for cascaded assemblies and any number of fiber optic paths 1022 may be used.

Figure 10C:
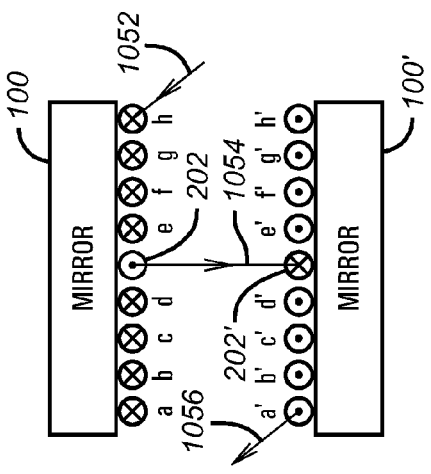
FIG. 10C illustrates operation of an alternative cascade embodiment that forms a face-to-face 8×8 digital optical switch according the present invention.

FIG. 10C is a schematic representation of an alternative cascaded embodiment of the present invention. Those skilled in the art would recognize that light is reversible. Therefore, any exit port described hereinabove can also be an incident light port. Shown is an 8×8 optical switch 1050 comprising a first mirror assembly 100 coupled to a second mirror assembly 100', which is substantially identical to the first mirror assembly 100. The mirror assemblies 100 and 100' are positioned, either separately or in a package, in a face-to-face relationship.

For simplicity of illustration, input ports are illustrated as a circle with an "X" in the circle, and each output port (internal and external to the package) is represented by a circle with a center dot. Each mirror assembly 100 and 100' is as described above and shown in FIGS. 1A–6. The two mirror assemblies are mounted in a face-to-face relationship to operate as a digital 8×8 optical switch, having 8 discrete input ports 206a–206h and 8 discrete exit ports 206a'–206h'.

An incident light beam 1052 enters one of the 8 incident light ports. The beam 1052 is switched according to the present invention within the first assembly 100 by a first mirror collection plate (not separately shown). The reflected beam then exits the first mirror assembly 100 through a first assembly exit port 202 as an internal incident light beam 1054 for the second assembly 100'. The internal beam 1054 enters the second assembly 100' through an incident light port 202'. A not-shown mirror according to the present invention described above disposed in the second assembly 100' operates according to the present invention to switch the internal beam 1054 toward one of the 8 exit ports 206a'–206h' as shown to create an exiting light beam 1056.

Figure 7A:
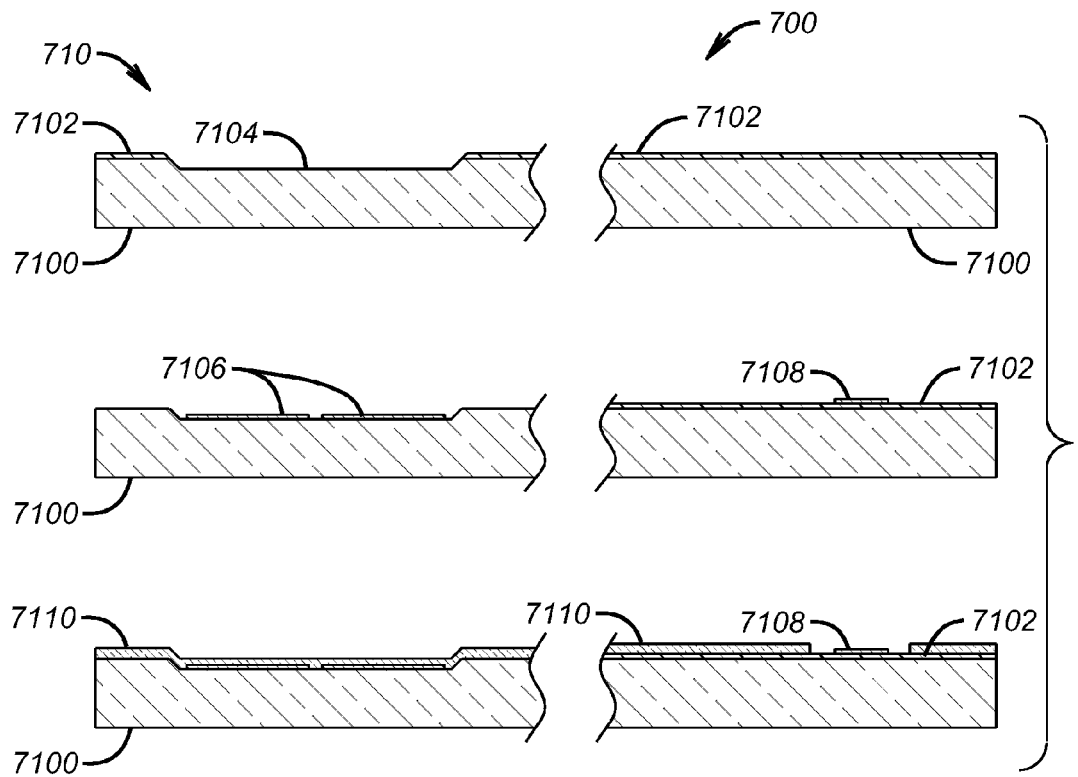
FIGS. 7A–C show a process according to the present invention for manufacturing the apparatus of FIGS. 1–6.
Figure 7B:
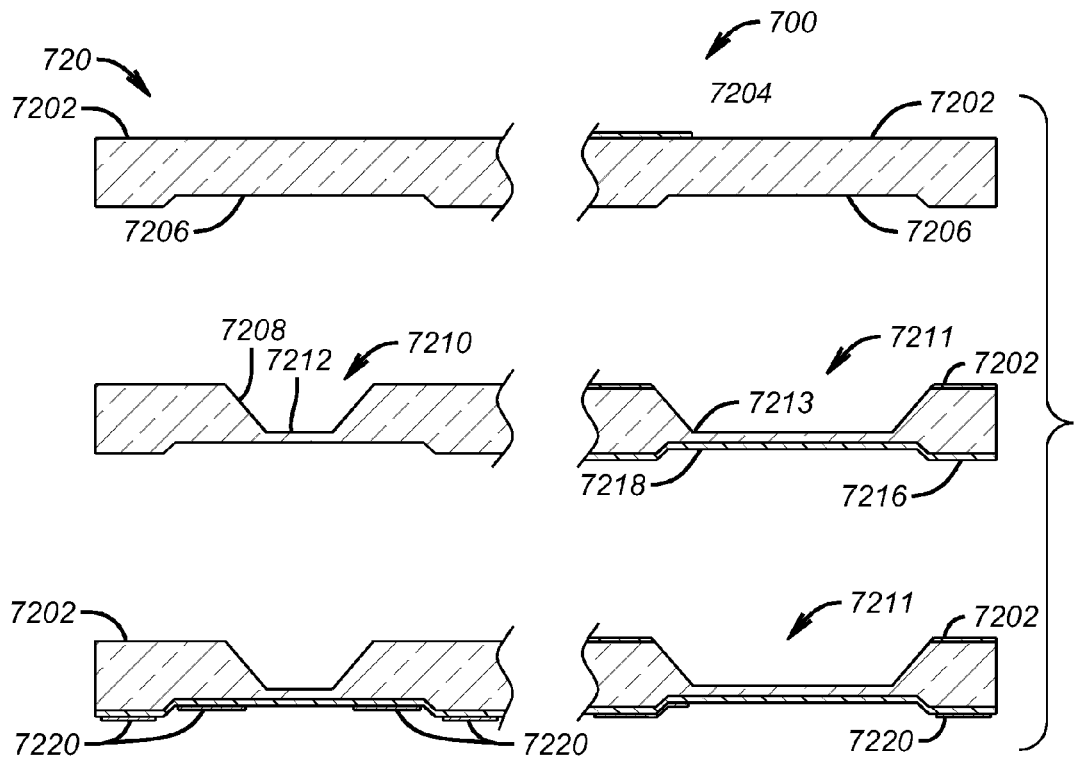
Figure 7C:
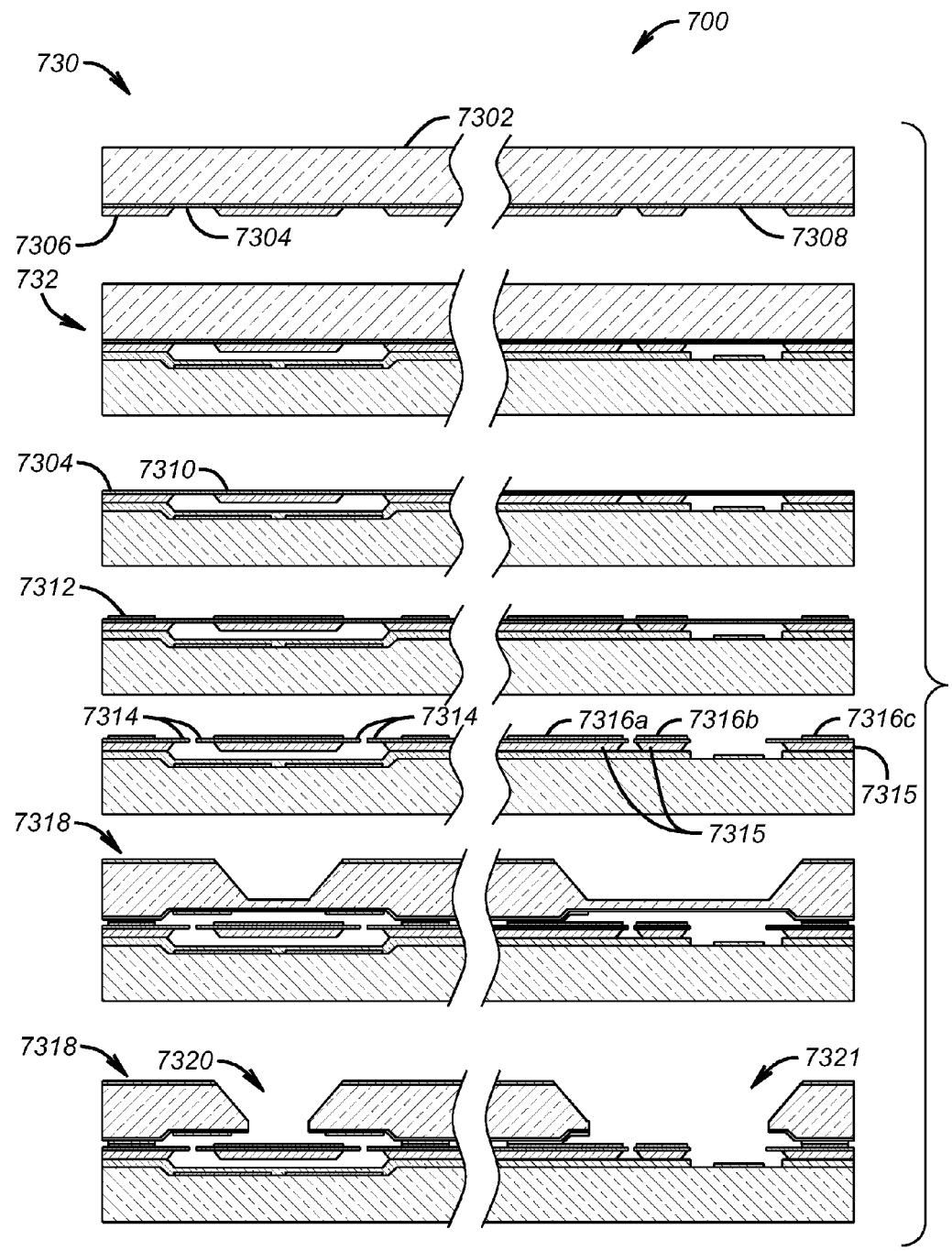

Now that the apparatus of the present invention has been described, a process according to the present invention for manufacturing a three dimensional MEMS apparatus will now be described. FIGS. 7A–7C show an exemplary micro-machining process 700 according to the present invention used in the manufacture of a three-dimensional MEMS device such as the digital optical switch apparatus 100 described above and shown in FIGS. 1–6 and 10. For clarity, the apparatus 100 is shown in cross section at several processing stages. This process 700 is separated into a bottom cap process 710, a top cap process 720 and a three-stack merged mirror process 730. The process 700 will be explained as a sequence of steps for clarity and ease of understanding. The use of sequential steps for purposes of explanation, however, should not be taken as a limitation of the scope of present invention to any particular manufacturing sequence.

Those skilled in the art will appreciate the novel processes used without the need for detailed description of known etching techniques. Thus, discussion of the techniques will be limited to direct attention on the process steps, which are the main focus of the invention.

Those skilled in the art will recognize an etching technique known as deep reactive ion etching, referred to as DRIE or DRIE etch. Also known in the art of MEMS based devices is the use of an epitaxial layer for providing desired electrical properties. Also known in the art is the use of boron doping techniques for providing desired electrical and mechanical properties. Doping is referred to as highly or heavily doped denoted by p++ or doping may be referred to as moderately doped denoted by p+. Doping layers of p++ or p+ are selected depending upon electrical properties desired and is also used as an etch-stop technique during the micro-machining fabrication processes. The high doping of these wafers provides enhanced, ohmic electrical contact between the doped wafers.

Referring now to FIG. 7A, the bottom cap process 710 begins with a substrate 7100 such as a 400 to 700 micron thick single-side polished (SSP) silicon wafer. An oxide insulating layer 7102 is applied, and then KOH etching is performed to create a 1- to 100 micron deep recess 7104 in an upper surface of the wafer.

Metal electrodes 7106 and metal pads 7108 are formed by known metal disposition techniques. The electrodes are patterned using, for example, thick resist.

A resistant glass layer 7110 is then applied to the top of the bottom cap in preparation for bonding the bottom cap to the mirror assembly. The glass layer is applied using evaporation, sputter or spin-on techniques known in the art.

Referring now to FIG. 7B, the top cap is formed according to the process 700 by providing a 400 to 700 micron thick double-side polished (DSP) silicon wafer 7202 with an oxide patterned mask 7204. KOH is then used to etch a top gap 7206 of 10 to 100 microns in the lower surface of the wafer 7202.

A second pattern mask 7208 is applied to an upper surface of the wafer 7202. Timed etching is performed using KOH to create an initial window 7210 in the top cap wafer 7202. The etching is stopped such that an approximately 1 to 50 micron section 7212 remains to maintain top cap wafer structural integrity for further processing steps. An advantage in this process is that the delicate mirror mechanisms are sealed and protected from potentially damaging process steps such as the dicing operation.

Top cap or top-side electrodes 7220 are created by depositing electrically conductive metal layers of 50 to 200 angstrom thick chrome (Cr) and then 500 to 800 angstrom thick gold (Au) or of Ti and Au of similar thickness, respectively. These layers also serve as mechanical bonding pads, although it is desirable to keep bond pads and conductive electrodes electrically isolated from each other in multi-electrode multi-tiered devices such as in the present invention.

FIG. 7C shows the process of the mirror assembly and apparatus completion stages, which are collectively referred to as the mirror process 730. The mirror assembly process begins with a 400 to 700 micron DSP epi silicon wafer 7302. The wafer 7302 is heavily doped with a p++ epi beam layer 7304 having a preferred thickness of about 1 to 10 microns. A lightly doped p+ structural layer 7306 is then applied over the beam layer 7304. The structural layer 7306 affects damping and the thickness should be selected along with other parameters to achieve critical damping for the overall structure. The structural layer 7306 is then masked, and etched using KOH etching to expose portions 7308 of the beam layer 7304. This portion of the process will enable creation of electrically isolated islands 7316*a–c*, which will be described in more detail later.

At 732, the mirror and bottom electrode wafer are then bonded using anodic bonding. If, however, the electrodes are initially formed by depositing layers of Cr and Au (respective thickness of 50–200 and 500–8000 Angstroms), then the preferred bonding technique is Au eutectic or thermal compression bonding. The mirror wafer 7302 is then thinned using KOH etching to expose an upper surface 7310 of the p++ layer 7304. Mirror metal 7312 is deposited on the exposed surface 7310.

Metal film stress can cause a MEMS mirror to exhibit bowing when thermally stressed, thereby resulting in loss of optical properties. Therefore, in one embodiment, the mirror wafer 7302 is preferably coated with mirror metal 7212 on both sides of the mirror. By coating both sides of the mirror with the same metal, thermal stress is more balanced and the mirror will exhibit less bowing. This embodiment is preferred when expected operational environments include wide temperature range.

A pattern mask is applied and DRIE etching is used to form beams 7314 and to form bond pad islands 7316. This provides electrically isolated electrodes, which are now separated by non-conductive air gaps.

The top cap electrode wafer is then bonded to the mirror wafer using a thermocompression bonding technique to form a three-tier stack 7318. The stack 7318, which as described above and shown in FIG. 1B comprises a plurality of mirror assemblies, is then diced to the desired number of mirror assemblies e.g. 1 to 8 or more. During the dicing portion of the process 700, all sensitive cavity areas of the stack are still sealed by remaining wafer portions 7212 and 7213. This technique provides the advantage of maintaining a non-contaminated environment for the sensitive areas e.g the mirror. After dicing, the remaining sealed cavities are opened, e.g. the window areas, by dry etching. Dicing techniques are well known and thus do not require detailed description here.

A pattern mask is applied and DRIE etching is used to form beams 7314 and to form bond pad islands 7315. This provides electrically isolated electrodes, which are now separated by non-conductive air gaps.

Now, blanket Si etching is performed to open a mirror window 7320 and bond pad window 7321 to expose the bond pads 7316 at the die level. At this point, a three dimensional multi-tier structure having multi-tier electrodes has been formed using planar machining techniques.

Figure 8A:
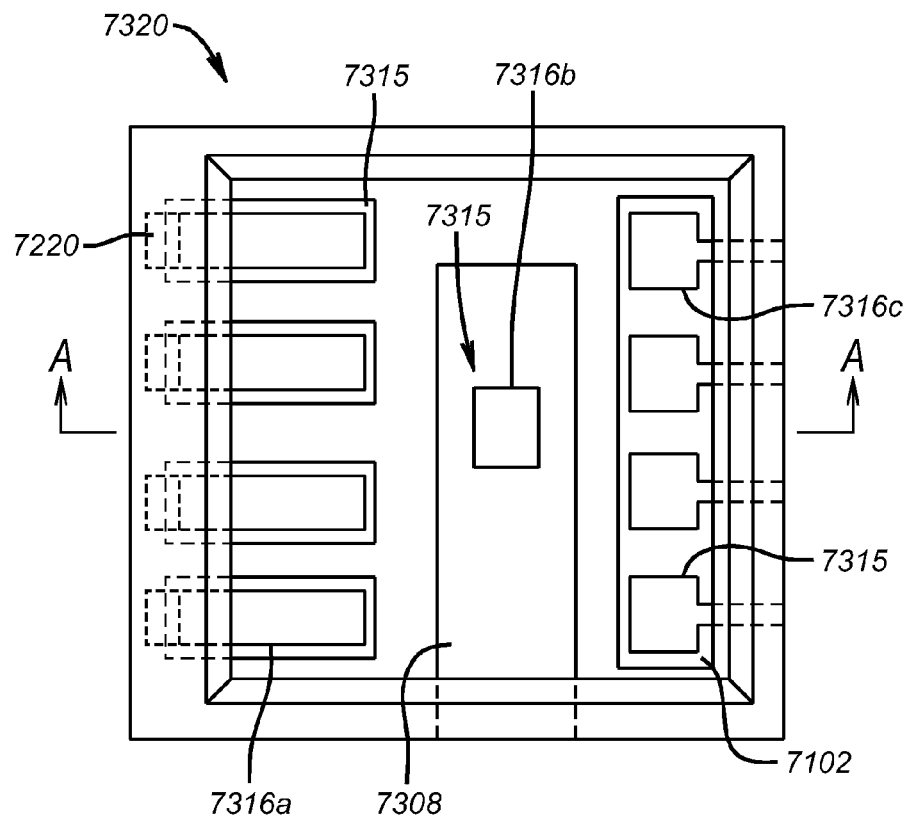
FIGS. 8A–B show views of a bond pad region of a device made using the process of FIGS. 7A–C.

Referring now to FIGS. 7A–C and FIGS. 8A–B an important manufacturing advantage will be described. FIG. 8A shows a top view of a bond pad region of the present invention. Shown is the bond pad window 7321 and the several bond pad islands 7315 created during the manufacturing processes 730. It is readily apparent that top cap electrical bond pads 7316*a,* mirror bond pad 7316*b* and bottom cap electrode bond pads 7316*c* are all accessible from a single direction for final packaging and assembly through the bond pad window 7321. One performing the final manufacturing process simply bonds appropriate electrical leads (such as leads 104 described above and shown in FIG. 1A to each bond pad 7316.

Figure 8B:
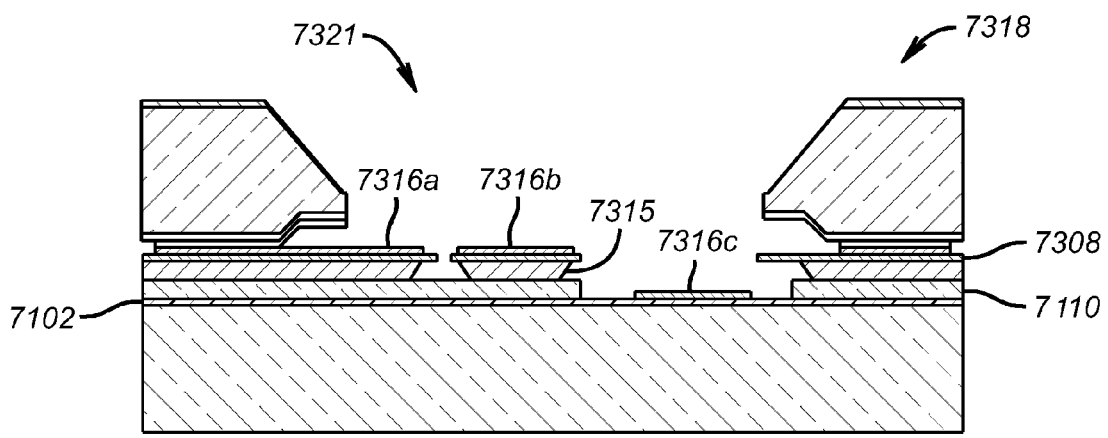

FIG. 8B is a cross section view along the plane A—A of FIG. 8A to provide a view to clearly show some of the features of the present invention. Shown are the three-tier stack assembly 7318 and the bond pad window 7321, which provides easy access to pads for final assembly and packaging. For comparison without limitation, the bond pad window 7321 might be manufactured as the bond pad window 118 described above and shown in FIG. 1B. Recall that the stack 7318 is manufactured using a fully planar process 700 according to the present invention. That is, there is no requirement in the process to rotate or flip any individual wafer or the stack in order to create the multi stack assembly shown. Moreover, the process provides an assembly having bond pads for each level of the stack accessible from one side through a bond pad window. In the embodiment shown, the bond pad window 7321 is on the top cap side of the assembly. Those skilled in the art having the benefit of the present disclosure would recognize that the top cap bond pad window is merely illustrative of the embodiment shown and does not limit the invention to having access only through a top cap bond pad window.

The top cap bond pad window 7321 provides access to the bottom cap electrode bond pad 7316*c*, to the mirror wafer electrode bond pad 7316*b*, and to the top cap electrode bond pad 7316*a*.

The figure also shows how layering is used to provide the three-dimensional structure using a planar process. The glass layer 7110 is shown on top of the bottom cap and between the bottom cap and the mirror wafer. The bottom cap electrode bond pads 7316*c* are on the glass layer 7110. The p++ epi silicon islands 7315 are formed from a layer of p++ epi silicon layer on the mirror wafer as shown. The mirror bond pad 7316*b* is substantially co-planar with the top cap electrode bond pad 7316*a*. The top cap electrode is connected to the top cap electrode bond pad 7316*a* via electrical bonding between the top cap electrical feed through 7220.

Figure 9A:
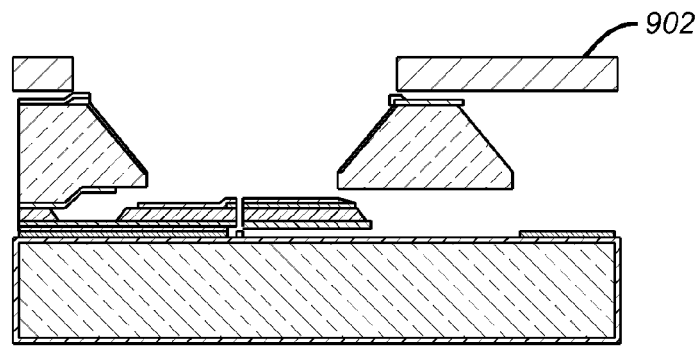
FIGS. 9A–9C show a shadow-masking method according to the present invention for optional use in the process of FIGS. 7A–C.
Figure 9B:
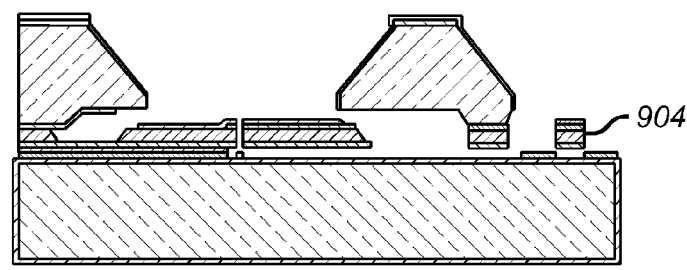
Figure 9C:
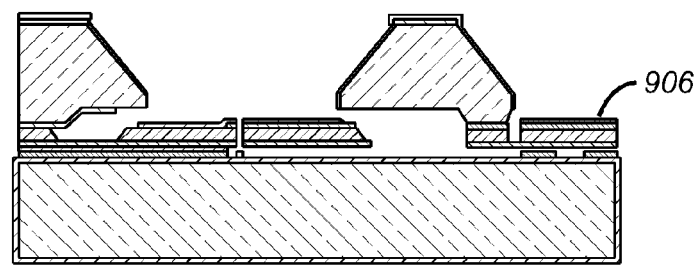

FIGS. 9A–9C show a shadow-masking portion of the process 700 according to the present invention. Creating bond pads in typical fashion can be quite complicated, time consuming and costly. A shadow mask is a portion of wafer material having a primary function of covering an area of a wafer surface. During metal deposition, such as for creating electrodes, metal is deposited on all surfaces in a substantially line-of-sight relationship with the direction of deposit. Typically, these are all upper surfaces. Thus, any area covered by a shadow mask does not receive sufficient metal deposits to create unwanted electrical short circuit paths.

Bond pad deposition according to the present invention may be accomplished using several embodiments of the process 700. One embodiment provides depositing metal directly to the bond-pad region using an exterior shadow mask 902. In this manner electrode bond pads are shielded from metal depositions to avoid shorting. The shadow mask 902 is not part of the stack, thus is removed during the manufacturing process immediately after metal deposition.

In another embodiment, an in-situ shadow mask 904 is created in the mirror assembly during the etching processes 720 that prevents metal from depositing in areas between electrodes. In this embodiment, the shadow mask 904 remains in the completed assembly.

Still in another embodiment, a frangible beam-like in-situ shadow mask is created in the mirror layer. This shadow mask shields bond pads from metal depositions that can create electrical short circuits. The shadow mask shield 906 are easily broken and removed after metal deposition using a typical manufacturing tool such as a vacuum pick.

Figure 11:
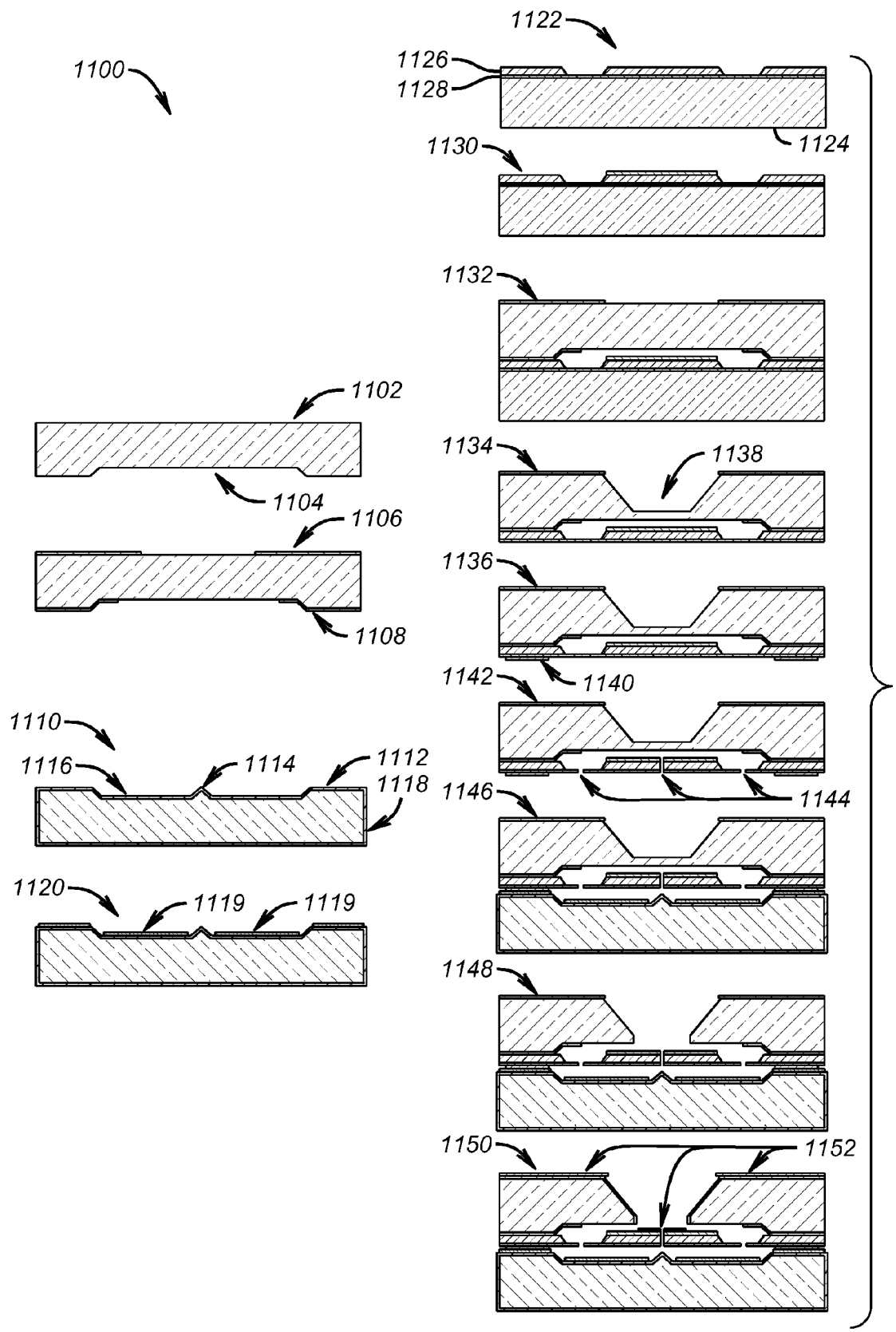
FIG. 11 illustrates an alternative process embodiment provided by the present invention.

Another embodiment of the process of the present invention provides inverted mirror manufacturing to allow alternate electrode routing and to provide a moderately doped p+ layer on which the mirror surface is formed. This process has the advantage of a smoother mirror surface at the microscopic level. The process 1100 is shown by illustration in FIG. 11.

Shown is the process 1100 beginning with a top cap wafer at 1102. The 400–700 micron wafer is provided with a Si oxide mask. A pattern mask is applied and a recess 1104 if etched using KOH etching. At 1106 a window mask is applied and top cap electrode bond pads 1108 are attached to the wafer.

The bottom cap starts at 1110 with a silicon SSp wafer 1112. A Si Oxide mask is applied for etching of a recess 1116 and for forming a cross-shaped baffle 1114 in a top surface of the bottom cap. An oxide insulation layer 1118 is then applied to the bottom cap surface.

Electrodes 1119 are then formed in the recess 1116 at 1120 by metal deposition techniques as described on process 700.

The mirror wafer begins at 1122 by providing a DSP wafer 1124. An epi p++ beam layer 1128 is applied and then a p+ structural layer 1126 is applied. A pad layer is provided using an oxide layer and a nitride layer. The pad layer is then masked and etched.

The nitride is then stripped and patterned leaving oxide on mirror surfaces 1130. The mirror oxide is broken up to clear DRIE lanes.

At 1132, the top cap and mirror wafers are bonded using fusion bonding, and at 1134 the mirror substrate is thinned to the p++ layer in KOH. The top cap is etched to form the windows 1138 (only mirror window shown in this view). As shown a portion of the window 1138 remains sealed for further processes.

At 1136 bond metal 1140 is deposited and patterned. The metal is preferably layered Ti and Au as discussed above with process 700. At 1142 pattern masking and etching is performed with beam-mirror separation mask to separate beams and mirror areas at several locations 1144.

The bonded top cap and mirror wafers are then bonded to the bottom cap at 1146 using thermocompression, and at 1148, the window 1138 is opened using blanket Si etch.

The stack is completed at 1150 by sputtering layers of Ti and Au 1152 using the shadow masking of FIGS. 9A–C to shield the bond pad window.

Figure 12:
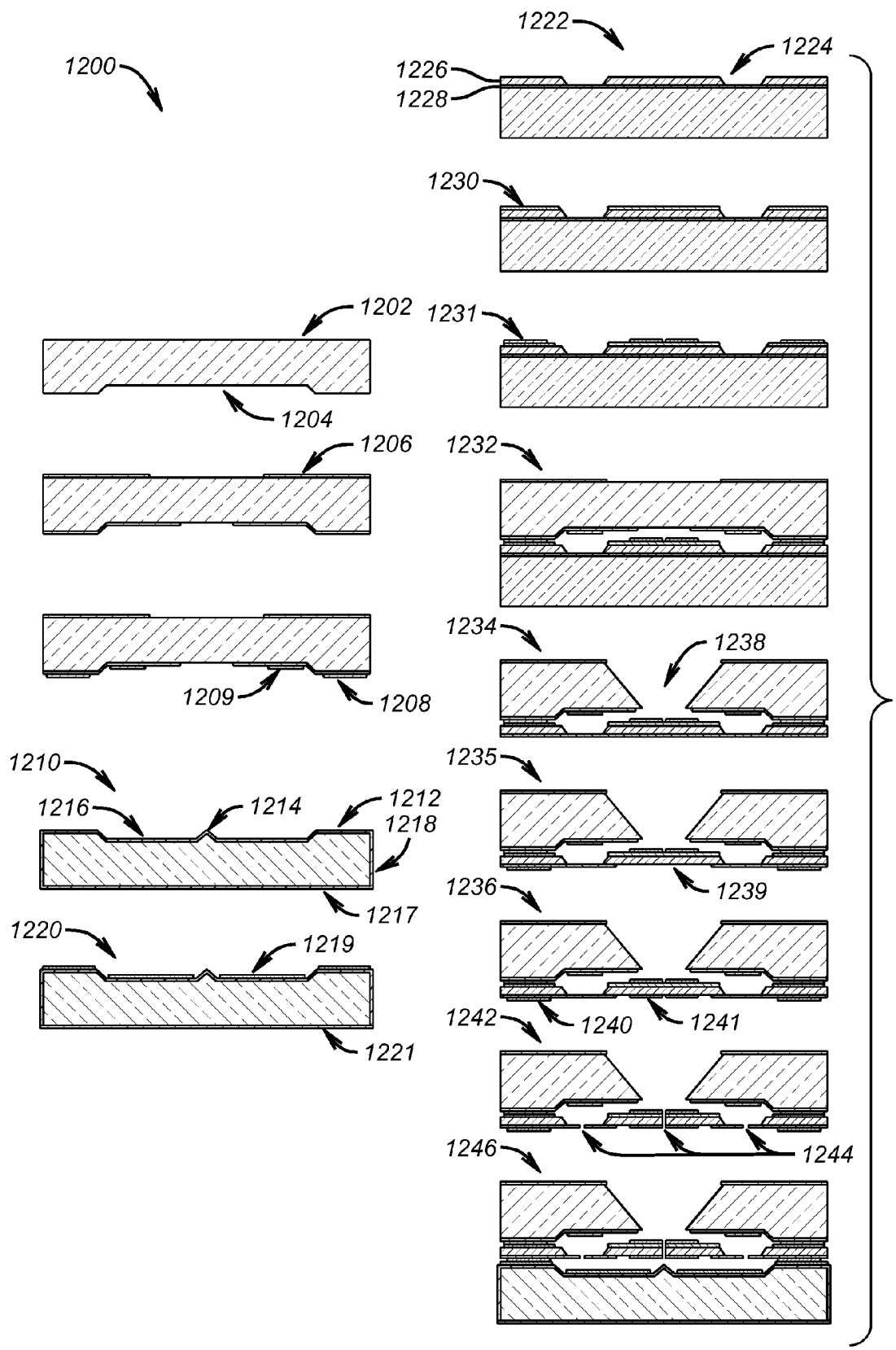
FIG. 12 is an alternative process embodiment with inverted mirror manufacturing to allow alternate electrode routing.

FIG. 12 is an alternative process embodiment with inverted mirror manufacturing to allow alternate electrode routing and to provide a moderately doped p+ layer on which the mirror surface in formed. The process 1200 illustrated in FIG. 12 has the advantage of a smoother mirror surface at the microscopic level. As much of the detailed bonding and depositions are substantially similar to the like processes described above, only the more general steps are described here for brevity.

Shown is the process 1200 beginning with a top wafer at 1202. The 400–700 micron wafer is provided with a Si oxide/nitride mask. A pattern mask is applied and a recess 1204 is etched using KOH etching. A window mask is applied 1206, and top cap electrode 1207 and bond pads 1208 are attached to the wafer.

A bottom cap starts at 1210 with a silicon SSP wafer 1212. A Si oxide/nitride mask is applied for etching of a recess 1216 and for forming a cross-shaped baffle 1214 in a top surface of the bottom cap. An oxide/nitride insulation layer 1218 is then applied to the bottom cap surface.

Electrodes 1219 are then formed in the recess 1216 at 1220 by metal deposition techniques as described on process 700.

The insulation layer 1217 on the backside of the wafer 1212 is removed. The metal layer 1221 is then formed in the backside of the wafer 1212 by metal deposition techniques as described above and shown in process 700.

The mirror wafer begins at 1222 by providing a DSP wafer 1224. An epi p++ beam layer 1228 is applied and then a p+ structural layer 1226 is applied. A pad layer 1230 is provided using an oxidation and a nitride layer. The pad layer is then masked and etched.

The bond metal 1231 is deposited and patterned.

At 1232 the top cap and mirror wafers are bonded using thermocompression bonding, and at 1234 the mirror substrate is thinned to the p++ layer in KOH. The top cap is etched to form the windows 1238 (only mirror window shown in this view).

At 1235 portion of the p++ layer on the backside of the mirror 1239 is removed, and, at 1236 metal layer 1241 is deposited on the backside of the mirror. This process minimizes the warping of the mirror.

At 1236 bond metal 1240 is also deposited and patterned.

At 1242 pattern masking and etching is performed with beam-mirror separation mask to separate beam and mirror areas at several locations 1244.

The process is completed at 1246 by bonding the bond top cap and mirror wafers and the bottom cap using thermocompression.

The foregoing description is directed to particular embodiments of the present invention for the purpose of illustration and explanation. It will be apparent, however, to one skilled in the art that many modifications and changes to the embodiment set forth above are possible without departing from the scope of the invention and the following claims.

What is claimed is:

1. A micro-machined device comprising:
   a) a housing;
   b) a support structure coupled to the housing;
   c) a mass coupled to the support structure by a pair of single-gimbaled structures for providing rotational movement of the mass about first and second axes of rotation; and
   d) a plurality of electrodes coupled to the housing in a diagonal relationship, one or more of the plurality of the electrodes capable of being energized with electrical power to provide a selectable force to the mass for moving the mass in one of a plurality of angular directions to a discrete stopping position for digital positioning of the mass to one of a plurality of digital switching positions.

2. The device of claim 1, wherein the single-gimbaled structures comprise T-shaped hinges.

3. The device of claim 1, wherein the housing comprises:
   i) a bottom wafer;
   ii) a middle wafer coupled to the bottom wafer; and
   iii) a top wafer coupled to the middle wafer, the top wafer having a light-permitting window formed therein.

4. The device of claim 3, wherein the middle wafer includes the mass, the hinges and the support structure.

5. The device of claim 1, wherein the mass includes a mirrored surface adapted to reflect an incident light beam in any of the plurality of angular directions.

6. The device of claim 4, wherein the mass includes a mirrored surface adapted to reflect an incident light beam in any of the plurality of angular directions, the incident light beam entering through the light-permitting window.

7. The device of claim 6 further comprising an overlay coupled to the top wafer, the overlay including a plurality of ports for allowing light to pass through the overlay.

8. The device of claim 7, wherein the plurality of ports include at least one entry port for directing the incident light beam toward the mirrored surface and at least one exit port for directing the reflected light from the mirrored surface.

9. The device of claim 1, wherein the mass includes one or more portions contacting the housing during angular movement to stop the angular movement such that the mass stops angular movement in the discrete stopping position.

10. The device of claim 9, wherein the mass includes a mirrored surface adapted to reflect an incident light beam, the reflected light leaving the mirrored surface in a direction controlled by the angular position of the mirrored surface.

11. A micro-machined device for controllably directing a beam of light, the device comprising:
  a) a mirror coupled to a support structure by a pair of single-gimbaled dual-axis hinges for providing rotational movement of the mass about first and second axes of rotation;
  b) a top cap bonded to the mirror support structure and having therein a window to allow light to reach the mirror;
  c) a bottom cap bonded to the mirror support structure;
  d) a plurality of electrodes disposed on at least one of the top cap and the bottom cap, one or more of the plurality of the electrodes capable of being energized with electrical energy to provide a selectable force to the mirror for moving the mirror in a plurality of angular directions, the mirror including one or more portions contacting at least one of the top cap and the bottom cap during angular movement to stop movement of the mirror such that the mirror position is one of a plurality of discrete predetermined angular positions for digital positioning of the mirror to one of a plurality of digital switching positions.

12. The device of claim 11, wherein the plurality of electrodes comprises a first plurality of electrodes positioned on the top cap and a second plurality of electrodes positioned on the bottom cap.

13. The device of claim 11 further comprising an overlay coupled to the top cap, the overlay including a plurality of ports for allowing light to pass through the overlay.

14. The device of claim 13, wherein the plurality of ports include at least one entry port for directing the incident light beam toward the mirrored surface and at least one exit port for directing the reflected light from the mirrored surface.

15. The device of claim 11 further comprising a plurality of optic fibers for directing light into and from the device.

16. The device of claim 14, further comprising a plurality of optic fibers coupled to the ports for directing light.

17. The device of claim 11 further comprising a movement control structure disposed on the bottom cap to control movement of the mirror.

18. The device of claim 17, wherein the movement control structure is adapted to controllably damp movement of the mirror.

19. The device of claim 17, wherein the mirror contacts the movement control structure to reduce vertical mirror movement.

20. The device of claim 11, wherein the mirror further comprises a layer of material on a surface opposite the mirror surface, the material being selected to balance stress across the mirror to reduce mirror bowing.

21. A micro-machined device for controllably directing a beam of light, the device comprising a plurality of mirror assemblies, each mirror assembly comprising:
  a) a mirror coupled to a support structure by a pair of single-gimbaled dual-axis hinges for providing rotational movement of the mass about first and second axes of rotation;
  b) a top cap bonded to the mirror support structure and having therein a window to allow light to reach the mirror;
  c) a bottom cap bonded to the mirror support structure; and
  d) a plurality of electrodes disposed on at least one of the top cap and the bottom cap, the electrodes when energized with electrical energy provide a selectable force to the mirror for moving the mirror in a plurality of angular directions, the mirror including one or more portions contacting at least one of the top cap and the bottom cap during angular movement to stop movement of the mirror such that the mirror position is one of a plurality of discrete predetermined angular positions,
  wherein light exiting a first mirror assembly is directed to enter a second mirror assembly.

22. The device of claim 21 further comprising a mirror fixed in relation to the first mirror assembly and the second mirror assembly to reflect light leaving the first mirror assembly toward the second mirror assembly.

23. The device of claim 21, wherein the first mirror assembly and the second mirror assembly are positioned substantially in a face-to-face relationship to allow light reflected from the first mirror assembly to enter the second mirror assembly.

24. The device of claim 21 further comprising a plurality of optic fibers coupled to the first mirror assembly and to the second mirror assembly for directing light leaving the first mirror assembly toward the second mirror assembly.

* * * * *